United States Patent
Ikarashi et al.

(10) Patent No.: US 8,975,728 B2
(45) Date of Patent: Mar. 10, 2015

(54) SEMICONDUCTOR DEVICE, SEMICONDUCTOR SUBSTRATE, METHOD FOR MANUFACTURING DEVICE, AND METHOD FOR MANUFACTURING SEMICONDUCTOR SUBSTRATE

(75) Inventors: Nobuyuki Ikarashi, Kanagawa (JP); Masayasu Tanaka, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 122 days.

(21) Appl. No.: 13/612,562

(22) Filed: Sep. 12, 2012

(65) Prior Publication Data
US 2013/0092949 A1   Apr. 18, 2013

(30) Foreign Application Priority Data
Oct. 18, 2011 (JP) ................. 2011-228536

(51) Int. Cl.
*H01L 29/20* (2006.01)
*H01L 21/02* (2006.01)
*H01L 33/00* (2010.01)
*H01L 33/32* (2010.01)

(52) U.S. Cl.
CPC ...... *H01L 21/0237* (2013.01); *H01L 21/02458* (2013.01); *H01L 21/02505* (2013.01); *H01L 21/0254* (2013.01); *H01L 21/0262* (2013.01); *H01L 21/02656* (2013.01); *H01L 33/007* (2013.01); *H01L 33/325* (2013.01)
USPC .......................... 257/615; 257/617; 438/483

(58) Field of Classification Search
USPC .................... 257/76, 615, 617; 438/483
See application file for complete search history.

(56) References Cited

U.S. PATENT DOCUMENTS

| 2007/0176210 A1* | 8/2007 | Murphy et al. ............... 257/211 |
| 2009/0278233 A1* | 11/2009 | Pinnington et al. .......... 257/615 |
| 2012/0104614 A1* | 5/2012 | Ikarashi et al. .............. 257/754 |

FOREIGN PATENT DOCUMENTS

JP     2004-146605 A     5/2004

* cited by examiner

*Primary Examiner* — Nicholas Tobergte
(74) *Attorney, Agent, or Firm* — Miles & Stockbridge P.C.

(57) ABSTRACT

A second epitaxial layer is grown epitaxially over a first epitaxial layer. The first epitaxial layer includes an epitaxially grown layer and a defect layer. The defect layer is disposed over the epitaxially grown layer and serves as a surface layer of the first epitaxial layer. The defect density of the defect layer is $5 \times 10^{17}$ cm$^{-2}$ or more. Defects penetrating through the defect layer form loops in the second epitaxial layer.

17 Claims, 12 Drawing Sheets

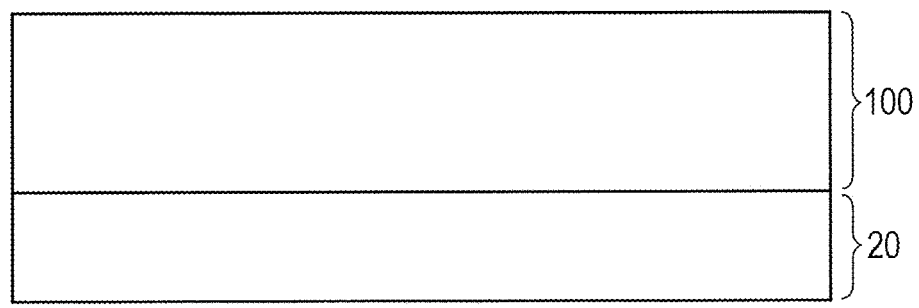
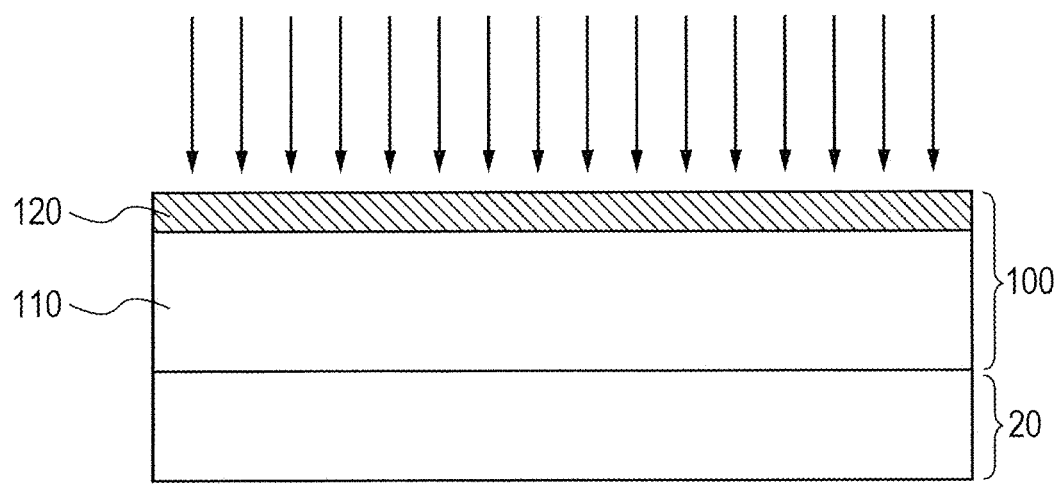

SAMPLE OF FIG. 3

SAMPLE 1 OF FIG. 4

US 8,975,728 B2

SEMICONDUCTOR DEVICE, SEMICONDUCTOR SUBSTRATE, METHOD FOR MANUFACTURING DEVICE, AND METHOD FOR MANUFACTURING SEMICONDUCTOR SUBSTRATE

CROSS-REFERENCE TO RELATED APPLICATIONS

The disclosure of Japanese Patent Application No. 2011-228536 filed on Oct. 18, 2011 including the specification, drawings and abstract is incorporated herein by reference in its entirety.

BACKGROUND

The present invention relates to a semiconductor device manufactured using a substrate including an epitaxial layer, semiconductor substrate, a method for manufacturing a semiconductor device, and a method for manufacturing a semiconductor substrate.

Nitride semiconductors such as GaN and AlGaN are used as the substrates of high-voltage semiconductor devices and light-emitting devices. Nitride semiconductor substrates obtained by epitaxially growing a nitride semiconductor layer over a substrate including Si, sapphire, or the like are used for cost reduction purposes. However, the lattice constant of a nitride semiconductor differs from that of the material included in the substrate. Thus, many dislocations occur in the nitride semiconductor layer.

On the other hand, Japanese Unexamined Patent Publication No. 2004-146605 discloses the following technology. First, a first nitride semiconductor layer is epitaxially grown over a sapphire substrate. Next, ions are implanted into the first nitride semiconductor layer. At this time, ions are implanted to the extent that the first nitride semiconductor layer is not amorphized. Specifically, an implantation acceleration voltage of 20 keV and a dose amount of $1 \times 10^{13}$ cm$^{-2}$ are shown as ion implantation conditions. This Publication states that the ions implanted as described above can terminate dangling bonds made by the dislocations. Subsequently, a second nitride semiconductor layer is epitaxially grown over the first nitride semiconductor layer.

SUMMARY

A reduction of the number of the dislocations in the epitaxial layer improves the performance of the element that uses the epitaxial layer. For this reason, it is desired to reduce the number of the dislocations in the epitaxial layer. However, the technology disclosed in Japanese Unexamined Patent Publication No 2004-146605 may allow a substantial number of dangling bonds made by the dislocations to remain. Accordingly, a substantial number of dislocations may remain in the second nitride semiconductor layer.

A semiconductor device according to a first aspect of the present invention includes: a first epitaxial layer; a second epitaxial layer formed over the first epitaxial layer; and an element formed using the second epitaxial layer. The first epitaxial layer includes: an epitaxially grown layer; and a defect layer that is disposed over the epitaxially grown layer, serves as a surface layer of the first epitaxial layer, and has a defect density of $5 \times 10^{17}$ cm$^{-2}$ or more. Dislocations are formed in the epitaxially grown layer.

A semiconductor device according to a second aspect of the present invention includes: a first epitaxial layer; a second epitaxial layer formed over the first epitaxial layer; and an element formed using the second epitaxial layer. The first epitaxial layer includes: an epitaxially grown layer; and a defect layer that is disposed over the epitaxially grown layer and serves as a surface layer of the first epitaxial layer. Dislocations are formed in the epitaxially grown layer. At least some of the dislocations penetrate through the defect layer and form loops in the second epitaxial layer without reaching a surface layer of the second epitaxial layer.

A semiconductor substrate according to a third aspect of the present invention includes: a first epitaxial layer; and a second epitaxial layer formed over the first epitaxial layer. The first epitaxial layer includes: an epitaxially grown layer; and a defect layer that is disposed over the epitaxially grown layer, serves as a surface layer of the first epitaxial layer, and has a defect density of $5 \times 10^{17}$ cm$^{-2}$ or more. Dislocations are formed in the epitaxially grown layer.

A semiconductor substrate according to a fourth aspect of the present invention includes: a first epitaxial layer; and a second epitaxial layer formed over the first epitaxial layer. The first epitaxial layer includes: an epitaxially grown layer; and a defect layer that is disposed over the epitaxially grown layer and serves as a surface layer of the first epitaxial layer. Dislocations are formed in the epitaxially grown layer. At least some of the dislocations penetrate through the defect layer and form loops in the second epitaxial layer without reaching a surface layer of the second epitaxial layer.

A method for manufacturing a semiconductor device according to a fifth aspect of the present invention includes: preparing a semiconductor substrate, the semiconductor substrate including a first epitaxial layer and a second epitaxial layer formed over the first epitaxial layer; and forming an element using the second epitaxial layer. The first epitaxial layer includes: an epitaxially grown layer; and a defect layer that is disposed over the epitaxially grown layer, serves as a surface layer of the first epitaxial layer, and has a defect density of $5 \times 10^{17}$ cm$^{-2}$ or more. Dislocations are formed in the epitaxially grown layer.

A method for manufacturing a semiconductor device according to a sixth aspect of the present invention includes: preparing a semiconductor substrate, the semiconductor substrate comprising a first epitaxial layer and a second epitaxial layer formed over the first epitaxial layer; and forming an element using the second epitaxial layer. The first epitaxial layer includes: an epitaxially grown layer; and a defect layer that is disposed over the epitaxially grown layer and serves as a surface layer of the first epitaxial layer. Dislocations are formed in the epitaxially grown layer. At least some of the dislocations penetrate through the defect layer and form loops in the second epitaxial layer without reaching a surface layer of the second epitaxial layer.

A method for manufacturing a semiconductor substrate according to a seventh aspect of the present invention includes: preparing a substrate and a first epitaxial layer formed over the substrate; forming a surface layer of the first epitaxial layer into a defect layer having a defect density of $5 \times 10^{17}$ cm$^{-2}$ or more; and epitaxially growing a second epitaxial layer over the defect layer.

According to the aspects of the present invention the number of the dislocations remaining in the second epitaxial layer can be reduced.

BRIEF DESCRIPTION OF THE DRAWINGS

FIGS. 2A and 2B are sectional views showing a method for manufacturing the semiconductor substrate shown in FIG. 1;

DETAILED DESCRIPTION

Now, embodiments of the present invention will be described with reference to the accompanying drawings. Like components are given like reference signs throughout the drawings and therefore descriptions thereof will be omitted as appropriate.

First Embodiment

Figure 1:
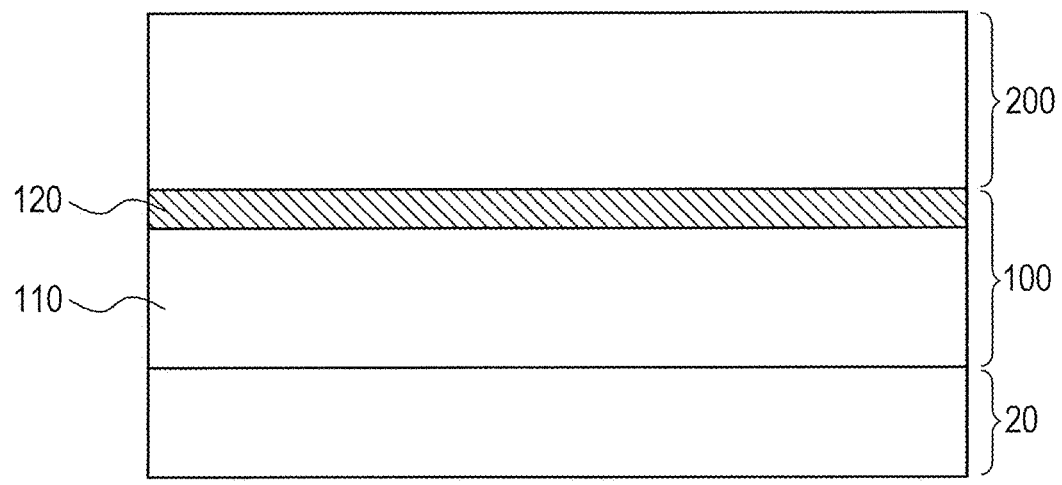
FIG. 1 is a sectional view showing the configuration of a semiconductor substrate according to a first embodiment.

FIG. 1 is a sectional view showing the configuration of a semiconductor substrate according to a first embodiment. This semiconductor substrate includes a substrate 20, a first epitaxial layer 100, and a second epitaxial layer 200.

The substrate 20 is, for example, a Si substrate, sapphire substrate, or SiC substrate but not limited thereto.

The first epitaxial layer 100 is grown epitaxially over the substrate 20. The first epitaxial layer 100 is a compound semiconductor layer, for example, a nitride semiconductor layer such as GaN, AlGaN, or InGaN. A buffer layer (not shown) may be formed between the first epitaxial layer 100 and the substrate 20.

The second epitaxial layer 200 is grown epitaxially over the first epitaxial layer 100. The second epitaxial layer 200 is, for example, a nitride semiconductor layer including GaN, AlGaN, or the like. The second epitaxial layer 200 preferably includes the same materials as the first epitaxial layer 100. In this case, the second epitaxial layer 200 and the first epitaxial layer 100 may have the same or different composition ratios. The second epitaxial layer 200 is, for example, 50 nm or thicker.

The first epitaxial layer 100 includes an epitaxially grown layer 110 and a defect layer 120. The defect layer 120 is disposed over the epitaxially grown layer 110 and serves as a surface layer of the first epitaxial layer 100. The epitaxially grown layer 110 is a layer which has not been subjected to a process such as ion implantation, of layers epitaxially grown over the substrate 20. The defect layer 120 is formed by introducing defects into a surface layer of a layer which is epitaxially grown over the substrate 20. The defect density of the defect layer 120 is $1–10^{17}$ cm$^{-2}$ or more, preferably $5 \times 10^{17}$ cm$^{-2}$ or more. Further, the defect density of the defect layer 120 is preferably $1 \times 10^{22}$ cm$^{-2}$ or less. Most of the defects of the defect layer 120, for example, 80% or more thereof are minute crystal defects including point defects less than 10 nm in size. The defect layer 120 is formed, for example, by implanting ions into a surface layer of the first epitaxial layer 100. Ions to be implanted are, for example, at least one of Si ions, Ge ions, Ga ions, As ions, and B ions but not limited thereto. The defect layer 120 is, for example, 50 nm or thicker and preferably 300 nm or thicker.

FIGS. 2A and 2B are sectional views showing a method for manufacturing the semiconductor substrate shown in FIG. 1. First, as shown in FIG. 2A, a substrate having the first epitaxial layer 100 formed over the substrate 20 is prepared. The substrate shown in FIG. 2A may be prepared by forming a buffer layer over the substrate 20 and epitaxially growing the first epitaxial layer 100 over the buffer layer.

Subsequently, as shown in FIG. 2B, ions are implanted into a surface layer of the first epitaxial layer 100. Thus, many defects are introduced into the surface layer of the first epitaxial layer 100, allowing the surface layer to serve as the defect layer 120. As described above, the defect density of the defect layer 120 is $5 \times 10^{17}$ cm$^{-2}$ or more.

Subsequently, as shown in FIG. 1, the second epitaxial layer 200 is epitaxially grown over the defect layer 120. As a result, the semiconductor substrate shown in FIG. 1 is formed.

Figure 3:
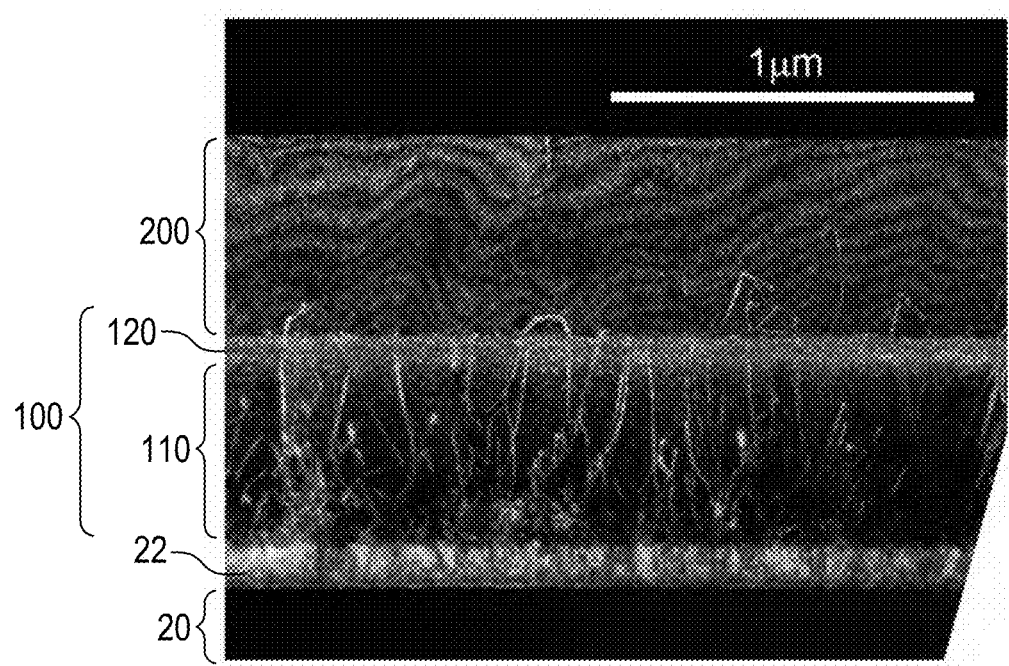
FIG. 3 is a sectional TEM image showing the effects of this embodiment.

Next, functions and effects of this embodiment will be described with reference to FIG. 3. FIG. 3 is a sectional transmission electron microscope (TEM) image of the semiconductor substrate shown in FIG. 1. In this sample, the first epitaxial layer 100 and the second epitaxial layer 200 are both a GaN layer. Ions implanted to form the defect layer 120 are Si ions. The ion implantation conditions are implantation energy of 30 keV and an implantation density of $5 \times 10^{15}$/cm$^{-2}$. Under these conditions, the defect density of the defect layer 120 becomes $2 \times 10^{19}$/cm$^{-2}$ (calculated value). In an example shown in this figure, a buffer layer 22 is formed between the substrate 20 and the first epitaxial layer 100.

As described above, the material included in the substrate 20 and the material included in the first epitaxial layer 100 have different lattice constants. For this reason, the first epitaxial layer 100 contains many dislocations. The dislocation density is about $1 \times 10^9$ cm$^{-2}$. On the other hand, the defect layer 120 contains multiple defects. Thus, some of the dislocations of the first epitaxial layer 100 are terminated by the defects of the defect layer 120.

However, not all the dislocations of the first epitaxial layer 100 are necessarily terminated by the defects. Some dislocations enter the second epitaxial layer 200. As described above, the defect density of the defect layer 120 is $5 \times 10^{17}$ cm$^{-2}$ or more. For this reason, the second epitaxial layer 200 receives stress at the interface with the defect layer 120. The dislocations grow obliquely in the second epitaxial layer 200. When the second epitaxial layer 200 grows, the dislocations are bound together, forming loops. Most of the dislocations penetrating through the defect layer 120 are terminated in the second epitaxial layer 200 without reaching the surface of the second epitaxial layer 200. Thus, the dislocation density of the surface layer of the second epitaxial layer 200 becomes one-tenth or less that of the epitaxially grown layer 110. As a result, the crystallinity of the surface of the second epitaxial layer 200 is improved.

Preventing the penetrating of the dislocations requires completely amorphizing the defect layer 120. However, completely amorphizing the defect layer 120 prevents the second epitaxial layer 200 from growing epitaxially in a favorable state. For example, if the defect layer 120 is nearly amorphized owing to too high a defect density (about 1000 times higher than the defect density of sample 1), the flatness of the surface of the second epitaxial layer 200 is significantly reduced. This results in a reduction in the crystallinity of the surface layer of the second epitaxial layer 200.

For this reason, the defect density of the defect layer 120 must be a level at which the second epitaxial layer 200 epitaxially grows. In contrast, if the surface is not completely amorphized, some dislocations may remain in the second epitaxial layer 200. In this embodiment, the remaining penetrating dislocations are looped by stress applied to the second epitaxial layer 200 by the defect layer 120. This prevents the dislocations from reaching the surface of the second epitaxial layer 200.

Figure 4:
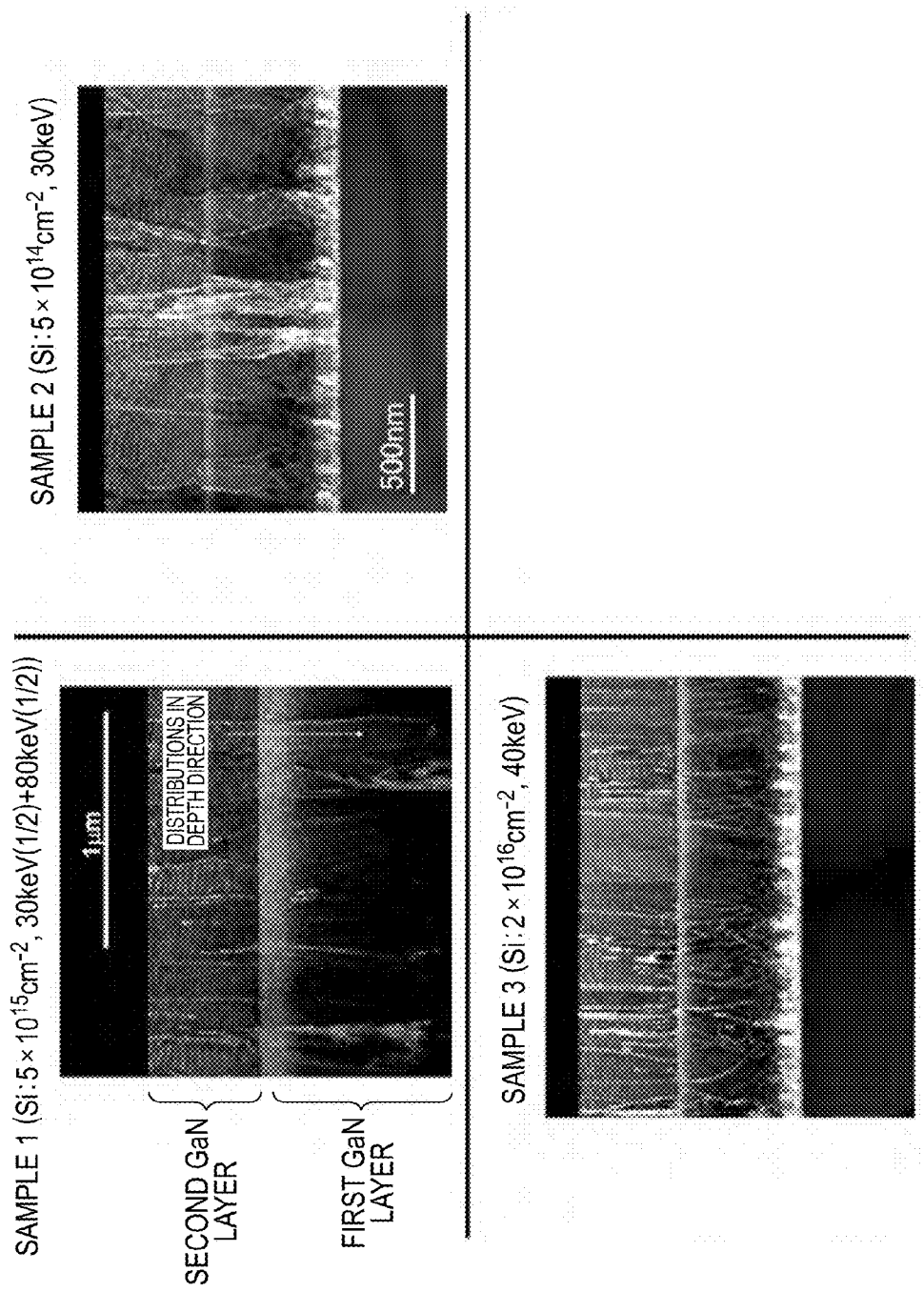
FIG. 4 includes sectional TEM images showing effects of this embodiment.

FIG. 4 includes sectional TEM images of multiple semiconductor substrates each including a defect layer 120 formed under different ion implantation conditions.

Sample 1 has the same Si ion implantation quantity surface density as the sample shown in FIG. 3. However, in half of sample 1, Si ions were implanted with higher energy (80 keV) than in the sample shown in FIG. 3. In sample 1, unlike in the sample of FIG. 3, most of the penetrating dislocations of the first GaN layer (first epitaxial layer 100) thread through the defect layer 120 and reach a surface of the second GaN layer (second epitaxial layer 200). Conceivably, this is because Si implanted with higher energy formed defects in a deeper region and thus the defect density of the surface layer of the defect layer 120 was reduced.

Figure 12A:
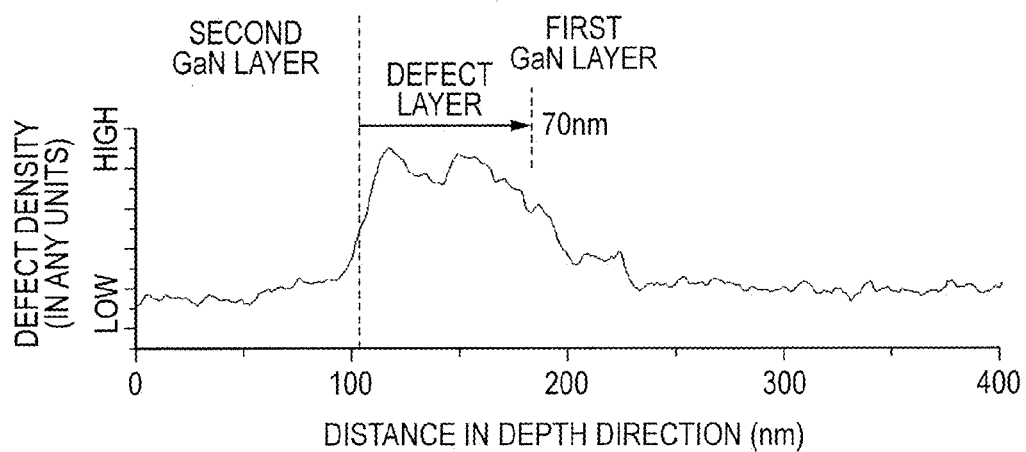
FIG. 12A is a graph showing distribution in the depth direction of the defect density of a sample shown in FIG. 3.
Figure 12B:
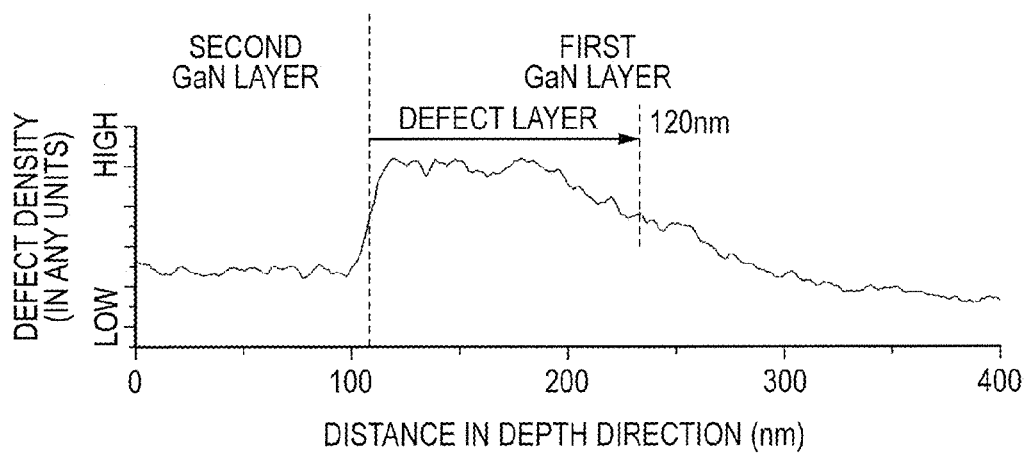
FIG. 12B is a graph showing distribution in the depth direction of the defect density of sample 1 shown in FIG. 4.

FIGS. 12A and 12B show the distributions in the depth direction of the respective defect densities of the sample shown in FIG. 3 and sample 1 of FIG. 4. These graphs clearly show that defects are distributed in deeper regions in sample 1 than in sample 3 shown in FIG. 3. Specifically, most defects are distributed in regions less than 100 nm deep in the sample shown in FIG. 3, while defects are distributed even in regions 100 nm or more deep in sample 1.

Figure 13:
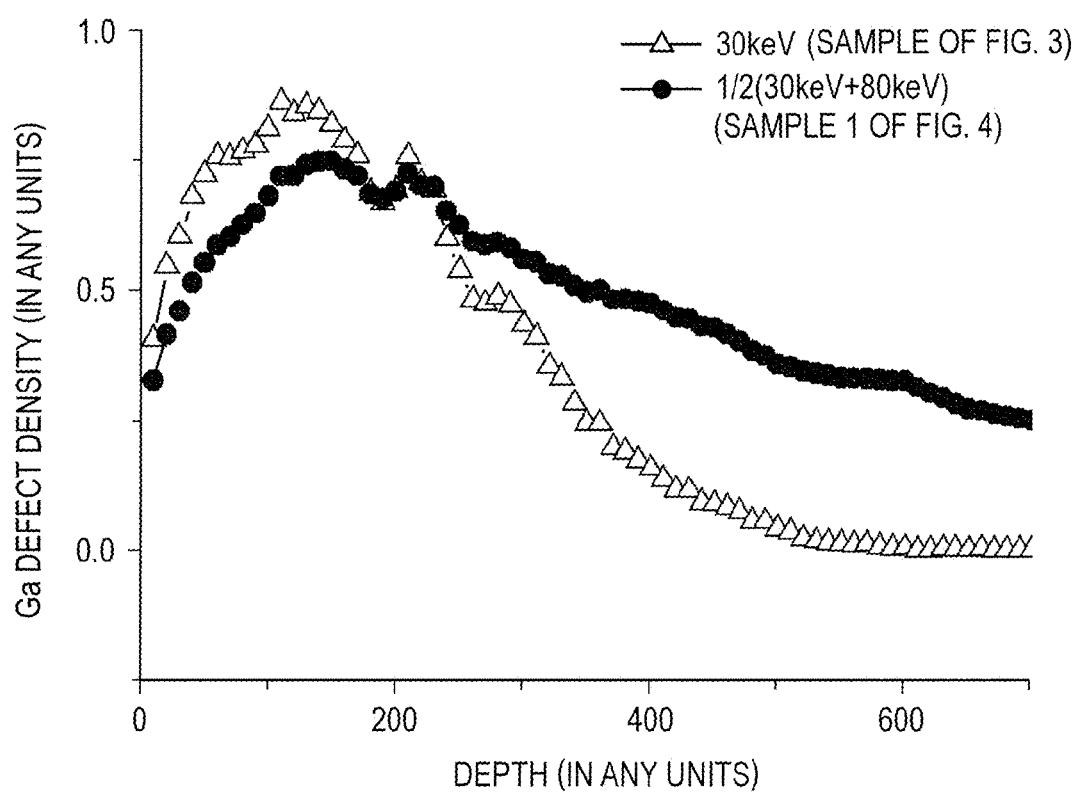
FIG. 13 is a diagram showing a calculated density of Ga defects in a defect layer.

FIG. 13 shows calculated densities of Ga defects in the defect layer 120. This graph clearly shows that the defect density of the surface layer is lower in sample 1 than in the sample shown in FIG. 3.

Referring back to FIG. 4, the ion dose amount of sample 2 is one digit less than that of sample 1 ($5\times10^{14}/cm^{-2}$). Accordingly, most of the dislocations penetrating through the defect layer 120 reach the surface layer of the second epitaxial layer 200.

In sample 3, Ar ions with a dose amount of $2\times10^{16}$ $cm^{-2}$ were implanted with energy of 40 keV to form the defect layer 120. In sample 3, some of the dislocations penetrating through the defect layer 120 are terminated in the second epitaxial layer 200, forming loops. However, many of the dislocations penetrating through the defect layer 120 reach the surface layer of the second epitaxial layer 200.

The above-mentioned results suggest that the process conditions for preventing the dislocations from reaching the surface layer of the second epitaxial layer 200 are very narrow.

In a process following the formation of the defect layer 120 (including a step of manufacturing a semiconductor device using the semiconductor substrate shown in FIG. 1), this semiconductor substrate may be subjected to heat treatment.

Figure 5:
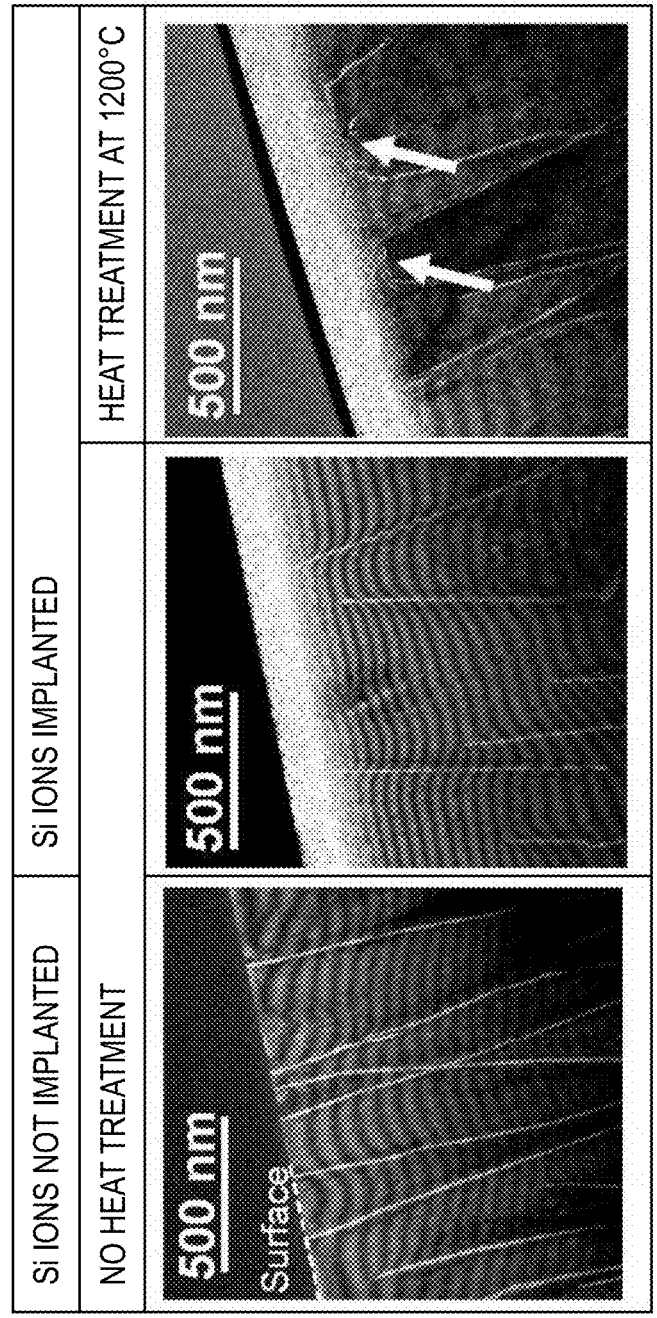
FIG. 5 includes sectional TEM images showing effects of this embodiment.

FIG. 5 shows sectional TEM images of a sample in which the defect layer 120 is not formed (left), a sample which was not subjected to heat treatment after forming the defect layer 120 by implanting Si ions (center), and a sample which was subjected to heat treatment after forming the defect layer 120 by implanting Si ions (right). The right sample was subjected to heat treatment at a temperature of 1200° C. for 3 minutes. These images suggest that the dislocations blocked by the defect layer 120 do not grow even when heat treatment is performed. Further, as shown by arrows in the figure, some dislocations formed loops. This indicates that the dislocations blocked by the defect layer 120 are thermally stable and do not enter the upper layer even when heat treatment is performed.

Second Embodiment

Figure 6:
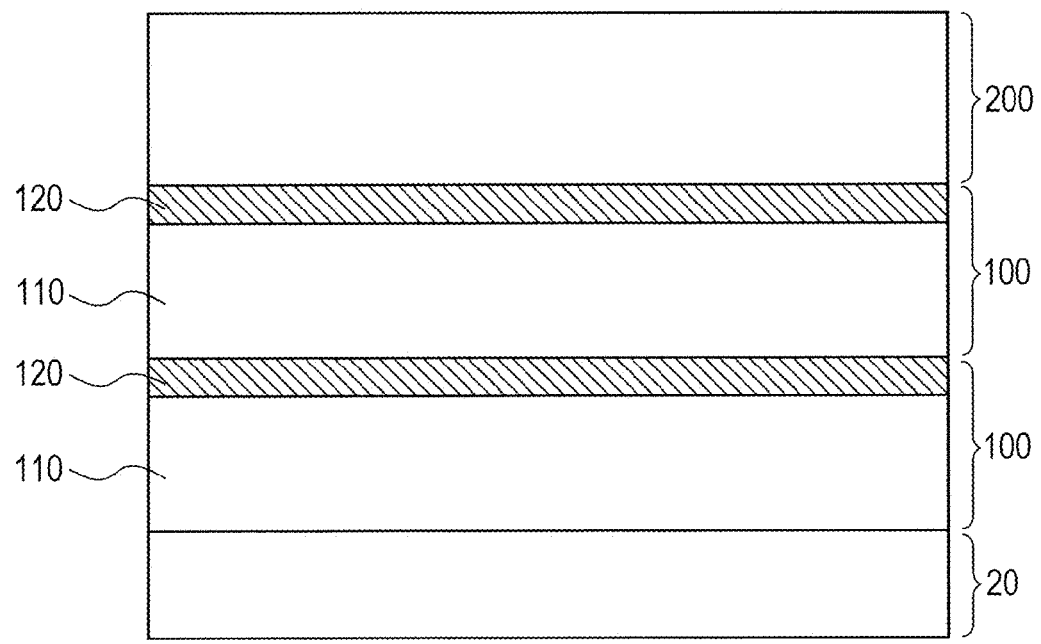
FIG. 6 is a sectional view showing the configuration of a semiconductor substrate according to a second embodiment.

FIG. 6 is a diagram showing the configuration of a semiconductor substrate according to a second embodiment. The semiconductor substrate shown in this diagram has the same configuration as the semiconductor substrate according to the first embodiment except that it includes multiple first epitaxial layers 100 (two layers in an example shown in the diagram). Each first epitaxial layer 100 includes an epitaxially grown layer 110 and a defect layer 120.

This embodiment can obtain the same effects as the first embodiment. Dislocations penetrating through the defect layer 120 of the lower first epitaxial layer 100 are blocked by the defect layer 120 of the upper first epitaxial layer 100. Accordingly, the number of dislocations that reach the surface layer of the second epitaxial layer 200 is further reduced.

Third Embodiment

Figure 7:
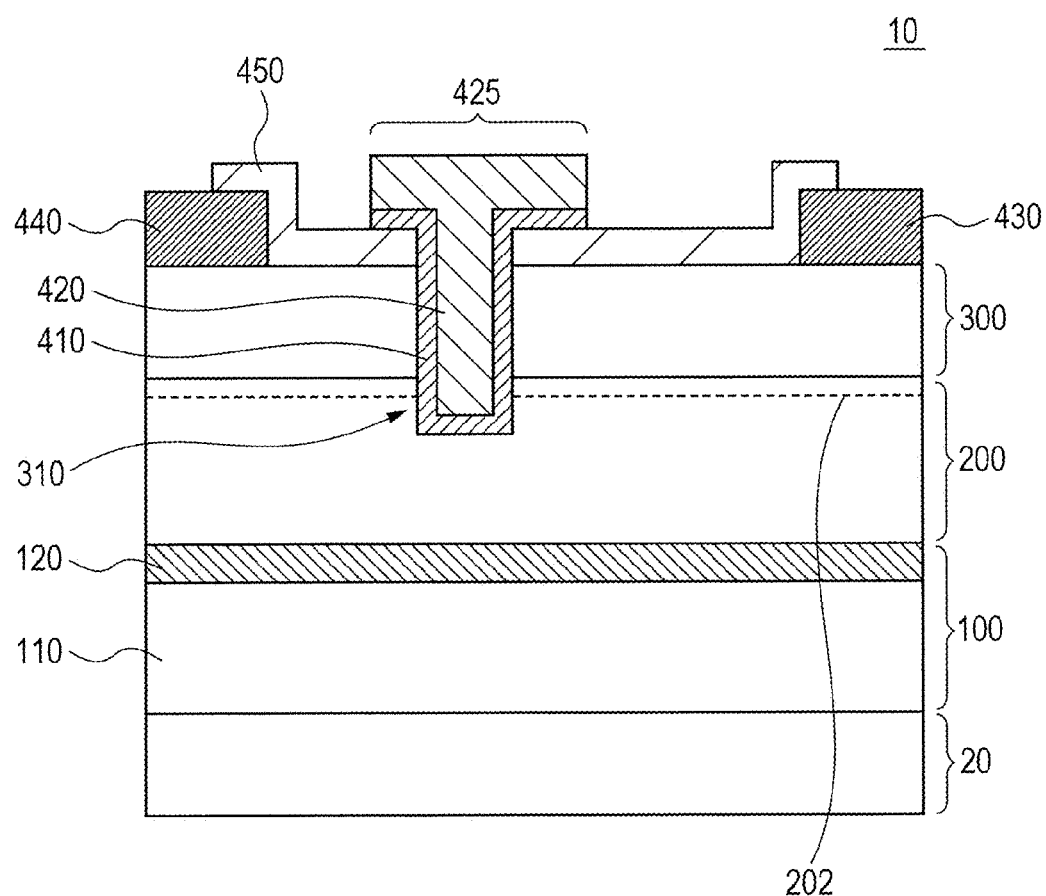
FIG. 7 is a sectional view of a semiconductor device according to a third embodiment.

FIG. 7 is a sectional view of a semiconductor device according to a third embodiment. The semiconductor device according to this embodiment is manufactured using the semiconductor substrate shown in FIG. 1 or FIG. 6. In FIG. 7, the semiconductor substrate shown in FIG. 1 is used. This semiconductor device includes a field-effect transistor 10. This semiconductor device includes the first epitaxial layer 100, the second epitaxial layer 200, a third epitaxial layer 300, a gate insulating film 410, and a gate electrode 420. The second epitaxial layer 200 serves as the channel layer of the field-effect transistor 10. In this embodiment, the resistance of the field-effect transistor 10 is reduced by use of a two-dimensional electron gas 202 generated over the interface between the second epitaxial layer 200 and the third epitaxial layer 300.

In this embodiment, the second epitaxial layer 200 serves as a channel layer. Thus, the gate insulating film 410 is in contact with the second epitaxial layer 200. For example, the second epitaxial layer 200 is an $Al_yGa_{1-y}N$ layer ($0 \leq y < 1$) if the first epitaxial layer 100 is an $Al_xGa_{1-x}N$ layer; it is an $Al_yIn_{1-y}N$ layer ($0 \leq y < 1$) if the first epitaxial layer 100 is an $Al_xIn_{1-x}N$ layer.

The third epitaxial layer 300 is grown epitaxially over the second epitaxial layer 200. The third epitaxial layer 300 serves as an electron supply layer and is disposed in order to form the two-dimensional electron gas 202 in the second epitaxial layer 200. Generation of the two-dimensional electron gas 202 requires the existence of conduction band discontinuity over the interface between the second epitaxial layer 200 and the third epitaxial layer 300. In other words, the third epitaxial layer 300 must have lower electron affinity than the second epitaxial layer 200 at the interface therebetween. For example, the third epitaxial layer 300 is an $Al_zGa_{1-z}N$ layer ($0 \leq z < 1$) if the second epitaxial layer 200 is an $Al_yGa_{1-y}N$ layer; it is an $Al_zIn_{1-z}N$ layer ($0 \leq z < 1$) if the second epitaxial layer 200 is an $Al_yIn_{1-y}N$ layer.

Note that z>y over the interface between the second epitaxial layer 200 and the third epitaxial layer 300. The purpose of making the Al composition ratio of the third epitaxial layer 300 higher than that of the second epitaxial layer 200 at the interface is to form conduction band discontinuity between the second epitaxial layer 200 and the third epitaxial layer 300 so as to generate the two-dimensional electron gas 202. At this interface, preferably z>y+0.05, and more preferably z>y+0.10. Thus, the two-dimensional electron gas 202 having a sufficient concentration is generated over the interface between the second epitaxial layer 200 and the third epitaxial layer 300.

A recess 310 is formed on the third epitaxial layer 300. The gate insulating film 410 is formed over the inner wall and bottom surface of the recess 310. The gate insulating film 410 includes, for example, silicon oxide ($SiO_2$) but may include aluminum oxide ($Al_2O_3$), hafnium oxide ($HfO_2$), silicon nitride (SiN), or aluminum nitride (AlN). The thickness of the gate insulating film 410 is, for example, 30 nm or more, preferably 50 nm or more, more preferably 70 nm or more. Increasing the thickness of the gate insulating film 410 can increase the gate withstand voltage of the field-effect transistor 10. In particular, increasing the thickness of the gate insulating film 410 to 70 nm or more can greatly improve the long-term reliability of the field-effect transistor 10.

The gate electrode 420 is embedded in space of the recess 310 where the gate insulating film 410 is not formed. That is, the gate electrode 420 faces the second epitaxial layer 200 through the gate insulating film 410. The gate electrode 420 includes, e.g., Au but may be a metallic monolayer film including Ni, Pt, or the like, a multilayer film of an Ni layer and an Au layer, a metallic multilayer film formed by layering multiple metals other than these metals, a metallic compound film including WSi, TiN, or the like, or a semiconductor material such as polysilicon.

In this embodiment, the gate insulating film 410 and the gate electrode 420 have an overhang 425 as their top portion. The overhang 425 extends from the recess 310 to over the third epitaxial layer 300 located around the recess 310. Disposition of the overhang 425 allows electric fields to concentrate on portions of the gate insulating film 410 located at the corners of the bottom of the recess 310, as well as on a portion thereof located at an edge of the overhang 425. Thus, the electric fields over the portions of the gate insulating film 410 located at the corners of the bottom of the recess 310 are relaxed. As a result, the withstand voltage of the field-effect transistor 10 is increased.

The bottom of the recess 310 reaches the second epitaxial layer 200 but does not reach the first epitaxial layer 100. In an example shown in this diagram, the bottom of the recess 310 is embedded in the second epitaxial layer 200. Thus, the two-dimensional electron gas 202 is blocked by the recess 310. As a result, a normally-off field-effect transistor 10 is obtained.

Formed over the third epitaxial layer 300 is a drain electrode 430 and a source electrode 440. The drain electrode 430 and the source electrode 440 are in ohmic contact with the third epitaxial layer 300. The drain electrode 430 and the source electrode 440 are, for example, multilayer films formed by layering Al on Ti. In an example shown in this figure, the distance from the drain electrode 430 to the gate electrode 420 is made longer than that from the source electrode 440 to the gate electrode 420 in order to increase the drain withstand voltage.

The region of the top surface of the third epitaxial layer 300 where none of the drain electrode 430 and the source electrode 440 is formed is covered by a protective insulating film 450. The protective insulating film 450 is, for example, a SiN film. The overhang 425 of the gate insulating film 410 and the gate electrode 420 is formed over the protective insulating film 450. The respective regions of the drain electrode 430 and the source electrode 440 adjacent to the overhang 425 are also covered by the protective insulating film 450.

Next, a method for manufacturing the semiconductor device shown in FIG. 7 will be described. First, the semiconductor substrate shown in FIG. 1 or FIG. 6 is prepared. This semiconductor substrate includes the substrate 20, the first epitaxial layer 100, and the second epitaxial layer 200. The first epitaxial layer 100 includes the defect layer 120.

Subsequently, the third epitaxial layer 300 is formed over the second epitaxial layer 200 by, e.g., MOCVD. In MOCVD, trimethylgallium (TMG), trimethylaluminum (TMA), and an ammonia gas are used as source gases. Subsequently, the third epitaxial layer 300 and the second epitaxial layer 200 are partially eliminated to the extent that the first epitaxial layer 100 is exposed. As a result, mesas are formed, isolating the elements.

Subsequently, a metallic film (e.g., a multilayer film formed by laying Ti and Al in this order) is formed over the third epitaxial layer 300 by sputtering and then selectively eliminated. Thus, the drain electrode 430 and the source electrode 440 are formed over the third epitaxial layer 300. The drain electrode 430 and the source electrode 440 are then subjected to annealing. Thus, the drain electrode 430 and the source electrode 440 make ohmic contact with the third epitaxial layer 300.

Subsequently, the protective insulating film 450 is formed over the third epitaxial layer 300 and the drain electrode 430 by plasma CVD. Portions of the protective insulating film 450, located over the drain electrode 430 and the source electrode 440 are eliminated.

Subsequently, a portion of the protective insulating film 450 where the recess 310 is to be formed is selectively eliminated. Subsequently, the third epitaxial layer 300 (and part of the second epitaxial layer 200, if necessary) is etched using the drain electrode 430, the source electrode 440, and the protective insulating film 450 as masks. Thus, the recess 310 is formed.

Subsequently, the gate insulating film 410 is formed over the bottom and side surfaces of the recess 310, over the protective insulating film 450, over the drain electrode 430, and over the source electrode 440 by, e.g., atomic layer deposition (ALD). Subsequently, the gate electrode 420 is formed over the gate insulating film 410 by, e.g., sputtering. Subsequently, unnecessary portions of the gate insulating film 410 and the gate electrode 420 are eliminated. Thus, a semiconductor device including the field-effect transistor 10 shown in FIG. 7 is formed.

Figure 8:
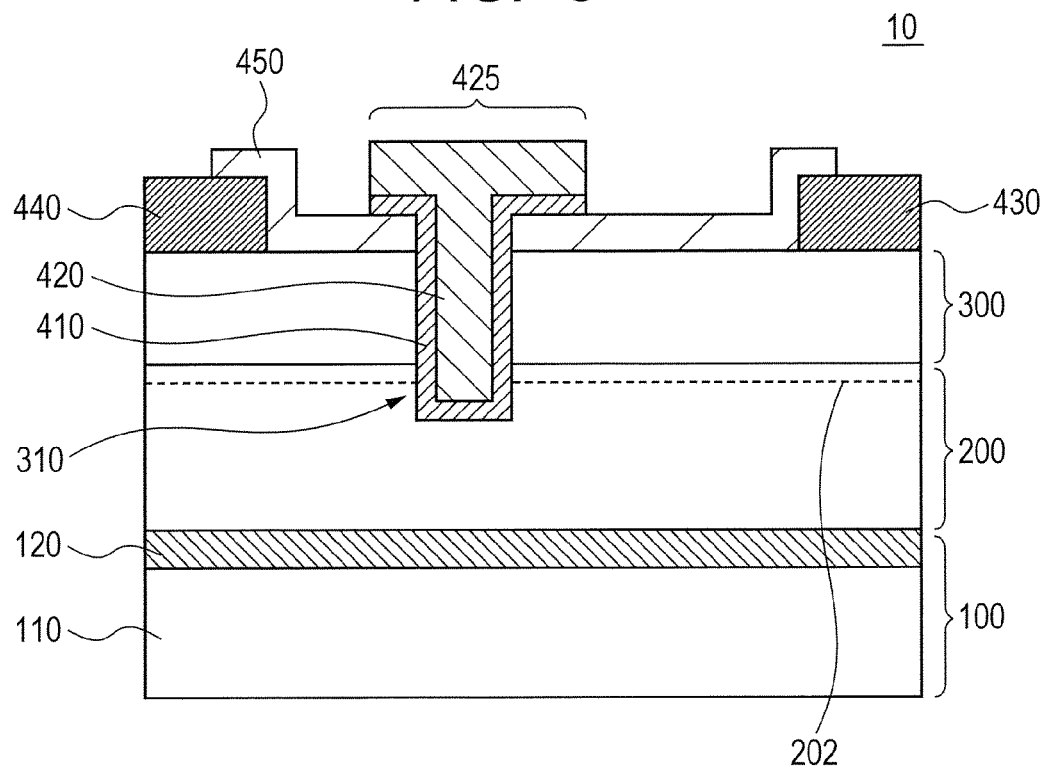
FIG. 8 is a sectional view showing a modification of FIG. 7.

As shown in FIG. 8, the substrate 20 may be eliminated after forming the field-effect transistor 10.

According to this embodiment, the field-effect transistor 10 is formed using the semiconductor substrate shown in the first embodiment or second embodiment. Since the number of dislocations in the second epitaxial layer 200 is small, characteristics of the field-effect transistor 10 are improved.

Fourth Embodiment

Figure 9:
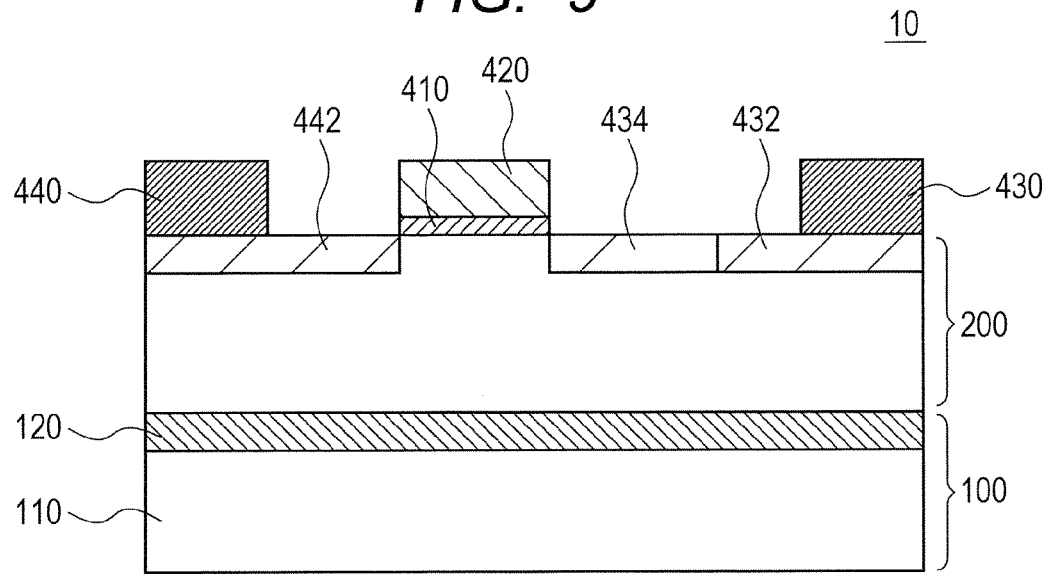
FIG. 9 is a sectional view showing the configuration of a semiconductor device according to a fourth embodiment.

FIG. 9 is a sectional view showing the configuration of a semiconductor device according to a fourth embodiment. This semiconductor device is the same as that according to the third embodiment except that the field-effect transistor 10 is a planar transistor.

Specifically, the third epitaxial layer 300 is not formed over the second epitaxial layer 200. The gate insulating film 410, the drain electrode 430, and the source electrode 440 are formed directly over the second epitaxial layer 200. The gate electrode 420 is formed over the gate insulating film 410.

A drain region 432 and a source region 442 are formed over a surface layer of the second epitaxial layer 200. The drain region 432 and the source region 442 are both an n-type impurity region. An extension region 434 is formed between the drain region 432 and the gate electrode 420 in plan view. The extension region 434 is also an n-type impurity region. On the other hand, the source region 442 does not include an extension region. The drain region 432, the source region 442, and the extension region 434 are formed, for example, by ion-implanting impurities such as Si into the second epitaxial layer 200. The disposition of the extension region 434 improves the withstand voltage between the gate electrode 420 and the drain electrode 430. However, if the withstand voltage required between the gate electrode 420 and the drain electrode 430 is not so large, the region serving as the extension region 434 may also be used as the drain region 432.

This embodiment can also obtain the same effects as the second embodiment. The third epitaxial layer 300 shown in the third embodiment is distorted in order to cause the second epitaxial layer 200 to generate the two-dimensional electron gas 202. For this reason, when the third epitaxial layer 300 exhibits a reverse piezoelectric effect, characteristics of the field-effect transistor 10 are degraded. On the other hand, this embodiment does not include the third epitaxial layer 300. As a result, characteristics of the field-effect transistor 10 are less likely to be degraded owing to the reverse piezoelectric effect.

Further, since there is no need to form the recess 310, the manufacturing cost is reduced.

Fifth Embodiment

Figure 10:
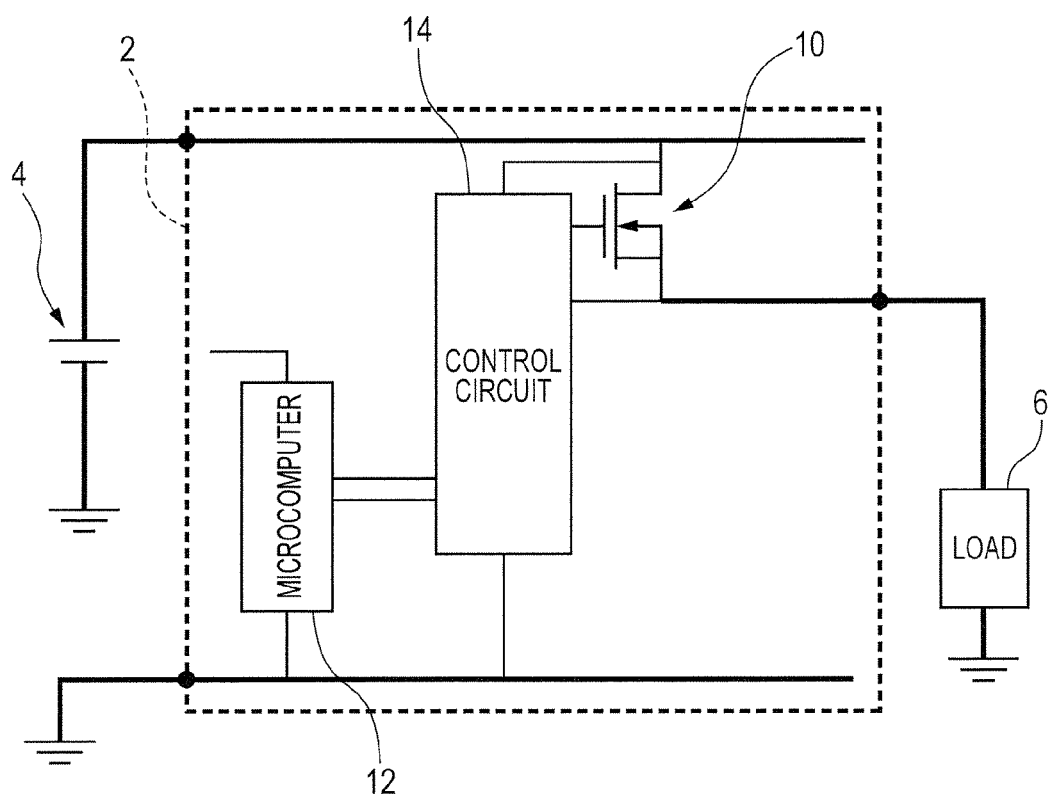
FIG. 10 is a diagram showing the circuit configuration of an electronic apparatus according to a fifth embodiment.

FIG. 10 is a diagram showing the circuit configuration of an electronic apparatus 2 according to a fifth embodiment. The electronic apparatus 2 includes the semiconductor device shown in the second embodiment or third embodiment (that is, the field-effect transistor 10). This electronic apparatus is used, for example, in a vehicle and includes the electronic apparatus 2, a power supply 4, and a load 6. The power supply 4 is, for example, a vehicle-mounted battery. The load 6 is, for example, a vehicle-mounted electronic component such as a head lamp or motor serving as the power source of a power window or vehicle. The electronic apparatus 2 controls electric power supplied to the load 6 by the power supply 4.

The electronic apparatus 2 is manufactured by mounting a semiconductor device including the field-effect transistor 10, semiconductor device 12, and control circuit 14 over a circuit substrate (e.g., printed wiring board). The semiconductor device 12 includes a microcomputer and is coupled to the field-effect transistor 10 via the wiring of the circuit substrate. The semiconductor device 12 controls the field-effect transistor 10. Specifically, the semiconductor device 12 inputs a control signal to the control circuit 14. The control circuit 14 inputs a signal to the gate electrode 420 of the field-effect transistor 10 in accordance with the control signal received from the semiconductor device 12. That is, the control circuit 14 controls the field-effect transistor 10. Controlling the field-effect transistor 10 allows electric power from the power supply 4 to be supplied to the load 6 as appropriate.

Sixth Embodiment

Figure 11:
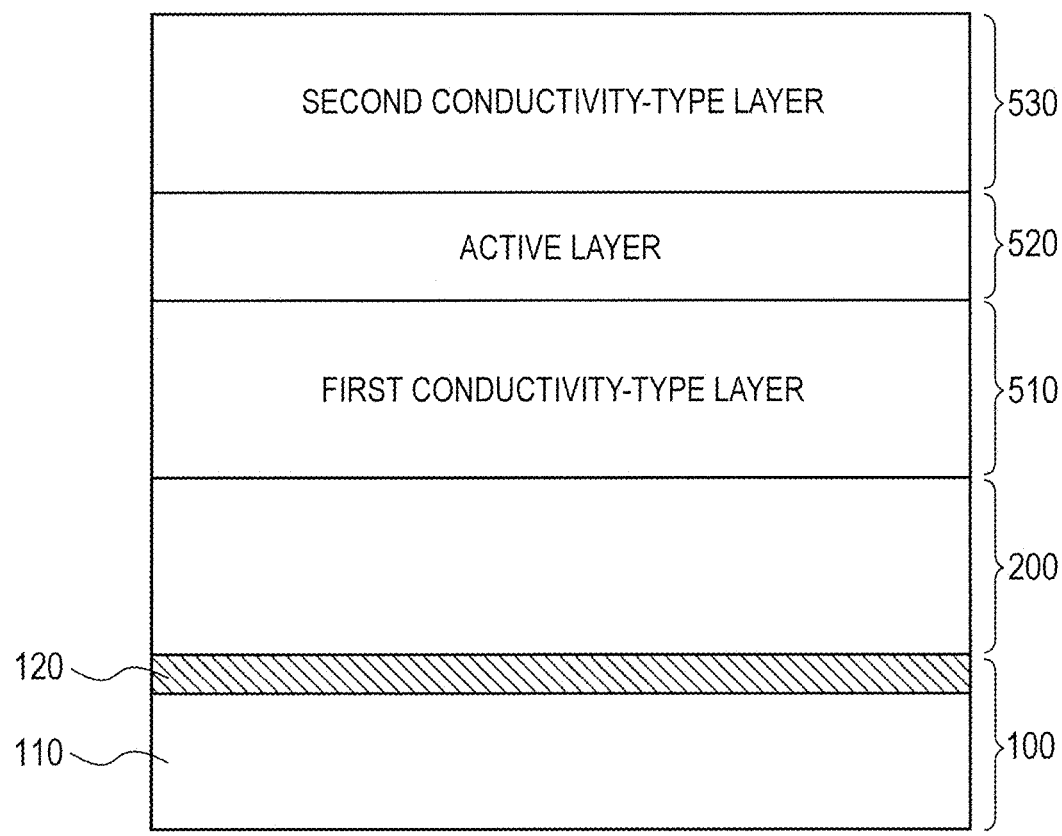
FIG. 11 is a sectional view showing the configuration of a semiconductor device according to a sixth embodiment.

FIG. 11 is a sectional view showing the configuration of a semiconductor device according to a sixth embodiment. This semiconductor device includes a light-emitting element 16. The light-emitting element 16 is formed using the semiconductor substrate shown in FIG. 1. Note that the substrate 20 is eliminated.

The light-emitting element 16 includes the second epitaxial layer 200, a first conductivity-type layer 510, an active layer 520, and a second conductivity-type layer 530. The first conductivity-type layer 510 is, for example, a first conductivity-type (e.g., n-type) AlGaN. The second conductivity-type layer 530 is, for example, a second conductivity-type AlGaN. The active layer 520 is a light-emitting layer having a quantum well structure and includes, e.g., InGaN.

The second epitaxial layer 200 includes the same material as the first conductivity-type layer 510. The first conductivity-type layer 510 shown in FIG. 11 may be omitted by causing, the second epitaxial layer 200 to serve also as the first conductivity-type layer 510.

According to this embodiment, the light-emitting element 16 is formed using the semiconductor substrate shown in the first embodiment. Since the number of dislocations in the second epitaxial layer 200 is small, characteristics of the light-emitting element 16 are improved.

While the embodiments of the present invention have been described with reference to the drawings, the embodiments are illustrative only. Various configurations other than those described above can be employed.

What is claimed is:

1. A semiconductor device comprising:
 a first epitaxial layer;
 a second epitaxial layer formed over the first epitaxial layer; and
 an element formed using the second epitaxial layer,
 wherein the first epitaxial layer includes:
  an epitaxially grown layer; and
  a defect layer that is disposed over the epitaxially grown layer, serves as a surface layer of the first epitaxial layer, and has a defect density of $5 \times 10^{17}$ cm$^{-2}$ or more, and
 wherein dislocations are formed in the epitaxially grown layer.

2. The semiconductor device according to claim 1, wherein at least some of the dislocations penetrate through the defect layer and form loops in the second epitaxial layer without reaching a surface layer of the second epitaxial layer.

3. A semiconductor device comprising:
 a first epitaxial layer;
 a second epitaxial layer formed over the first epitaxial layer; and
 an element formed using the second epitaxial layer,
 wherein the first epitaxial layer includes:
  an epitaxially grown layer; and
  a defect layer that is disposed over the epitaxially grown layer and serves as a surface layer of the first epitaxial layer,
 wherein dislocations are formed in the epitaxially grown layer, and
 wherein at least some of the dislocations penetrate through the defect layer and form loops in the second epitaxial layer without reaching a surface layer of the second epitaxial layer.

4. The semiconductor device according to claim 1, wherein defects of the defect layer are each less than 10 nm in size.

5. The semiconductor device according to claim 1, wherein a density of dislocations in the surface layer of the second epitaxial layer is one-tenth a density of the dislocations in the epitaxially grown layer.

6. The semiconductor device according to claim 1, wherein the defect layer is 50 nm or thicker.

7. The semiconductor device according to claim 1,
wherein the first epitaxial layer and the second epitaxial layer both comprise an identical material.

8. The semiconductor device according to claim 7,
wherein the material is a nitride semiconductor.

9. The semiconductor device according to claim 8,
wherein the nitride semiconductor is one of GaN and AlGaN.

10. The semiconductor device according to claim 1, further comprising:
a substrate over which the first epitaxial layer is formed.

11. The semiconductor device according to claim 10,
wherein the substrate is one of a Si substrate, a sapphire substrate, and a SiC substrate.

12. The semiconductor device according to claim 1,
wherein the defect layer is formed by implanting ions into the surface layer of the first epitaxial layer.

13. The semiconductor device according to claim 12,
wherein the ions are at least one of Si ions, Ge ions, Ga ions, As ions, and B ions.

14. The semiconductor device according to claim 1,
wherein the element is one of a transistor and a light-emitting element.

15. A semiconductor substrate comprising:
a first epitaxial layer; and
a second epitaxial layer formed over the first epitaxial layer,
wherein the first epitaxial layer includes:
an epitaxially grown layer; and
a defect layer that is disposed over the epitaxially grown layer, serves as a surface layer of the first epitaxial layer, and has a defect density of $5 \times 10^{17}$ cm$^{-2}$ or more, and
wherein dislocations are formed in the epitaxially grown layer.

16. A semiconductor substrate comprising:
a first epitaxial layer; and
a second epitaxial layer formed over the first epitaxial layer;
wherein the first epitaxial layer includes:
an epitaxially grown layer; and
a defect layer that is disposed over the epitaxially grown layer and serves as a surface layer of the first epitaxial layer,
wherein dislocations are formed in the epitaxially grown layer, and
wherein some of the dislocations penetrate through the defect layer and form loops in the second epitaxial layer without reaching a surface layer of the second epitaxial layer.

17. A method of manufacturing a semiconductor device, comprising:
preparing a semiconductor substrate, the semiconductor substrate comprising a first epitaxial layer and a second epitaxial layer formed over the first epitaxial layer; and
forming an element using the second epitaxial layer,
wherein the first epitaxial layer includes:
an epitaxially grown layer; and
a defect layer that is disposed over the epitaxially grown layer, serves as a surface layer of the first epitaxial layer, and has a defect density of $5 \times 10^{17}$ cm$^{-2}$ or more, and
wherein dislocations are formed in the epitaxially grown layer.

* * * * *